(12) United States Patent
Chiu et al.

(10) Patent No.: US 9,417,642 B2
(45) Date of Patent: Aug. 16, 2016

(54) BOOTSTRAP DC-DC CONVERTER

(71) Applicant: Anpec Electronics Corporation, Hsin-Chu (TW)

(72) Inventors: Liang-Hsiang Chiu, Hsinchu County (TW); Chih-Yuan Chen, Hsinchu (TW)

(73) Assignee: Anpec Electronics Corporation, Hsin-Chu (TW)

( * ) Notice: Subject to any disclaimer, the term of this patent is extended or adjusted under 35 U.S.C. 154(b) by 0 days.

(21) Appl. No.: 13/747,446

(22) Filed: Jan. 22, 2013

(65) Prior Publication Data

US 2014/0159680 A1 Jun. 12, 2014

(30) Foreign Application Priority Data

Dec. 6, 2012 (TW) .............................. 101145876 A

(51) Int. Cl.
*G05F 1/00* (2006.01)
*G05F 1/46* (2006.01)
*H02M 3/158* (2006.01)
*H03K 17/06* (2006.01)

(52) U.S. Cl.
CPC .............. *G05F 1/468* (2013.01); *H02M 3/1588* (2013.01); *H03K 17/063* (2013.01); *H03K 2217/0081* (2013.01); *Y02B 70/1466* (2013.01)

(58) Field of Classification Search
CPC ......... H02M 3/07; H02M 3/073; H02M 3/10; H02M 3/155; H02M 3/156; H02M 3/1563; H02M 3/157; H02M 3/1588; H02M 3/158; H02M 2001/0032; G05F 1/00; G05F 1/462; G05F 1/56; G05F 1/562; G05F 1/565; G05F 1/569; G05F 1/575; G05F 1/62; G05F 1/468; G11C 5/145; H03K 17/06; H03K 17/063; H03K 17/066; H03K 19/01714; H03K 19/01735; H03K 2217/0081; Y02B 70/1466
USPC ......... 323/271–276, 282–289, 351, 222–226; 327/390, 589, 391; 326/88, 92
See application file for complete search history.

(56) References Cited

U.S. PATENT DOCUMENTS

| | | | | |
|---|---|---|---|---|
| 5,705,919 | A * | 1/1998 | Wilcox | 323/282 |
| 7,019,501 | B2 * | 3/2006 | Dogome et al. | 323/282 |
| 7,321,258 | B2 * | 1/2008 | Wong et al. | 327/589 |
| 7,834,606 | B2 * | 11/2010 | Liu et al. | 323/283 |
| 2007/0210780 | A1 * | 9/2007 | Kataoka | 323/285 |
| 2009/0002049 | A1 * | 1/2009 | Chen | 327/333 |
| 2013/0176004 | A1 * | 7/2013 | Lai et al. | 323/234 |

FOREIGN PATENT DOCUMENTS

| | | |
|---|---|---|
| CN | 102386767 A | 3/2012 |
| TW | 201237585 | 9/2012 |

* cited by examiner

*Primary Examiner* — Timothy J Dole
*Assistant Examiner* — Carlos Rivera-Perez
(74) *Attorney, Agent, or Firm* — Winston Hsu; Scott Margo

(57) ABSTRACT

The present invention discloses a bootstrap DC-DC converter. The bootstrap DC-DC converter includes a lower gate driver, for generating a lower gate control signal according to a control signal; a lower gate, for turning on and turning off according to a lower gate control signal; and a bootstrap voltage maintaining circuit, for generating the control signal, such that the lower gate turns on at least a minimum off time each time.

3 Claims, 7 Drawing Sheets

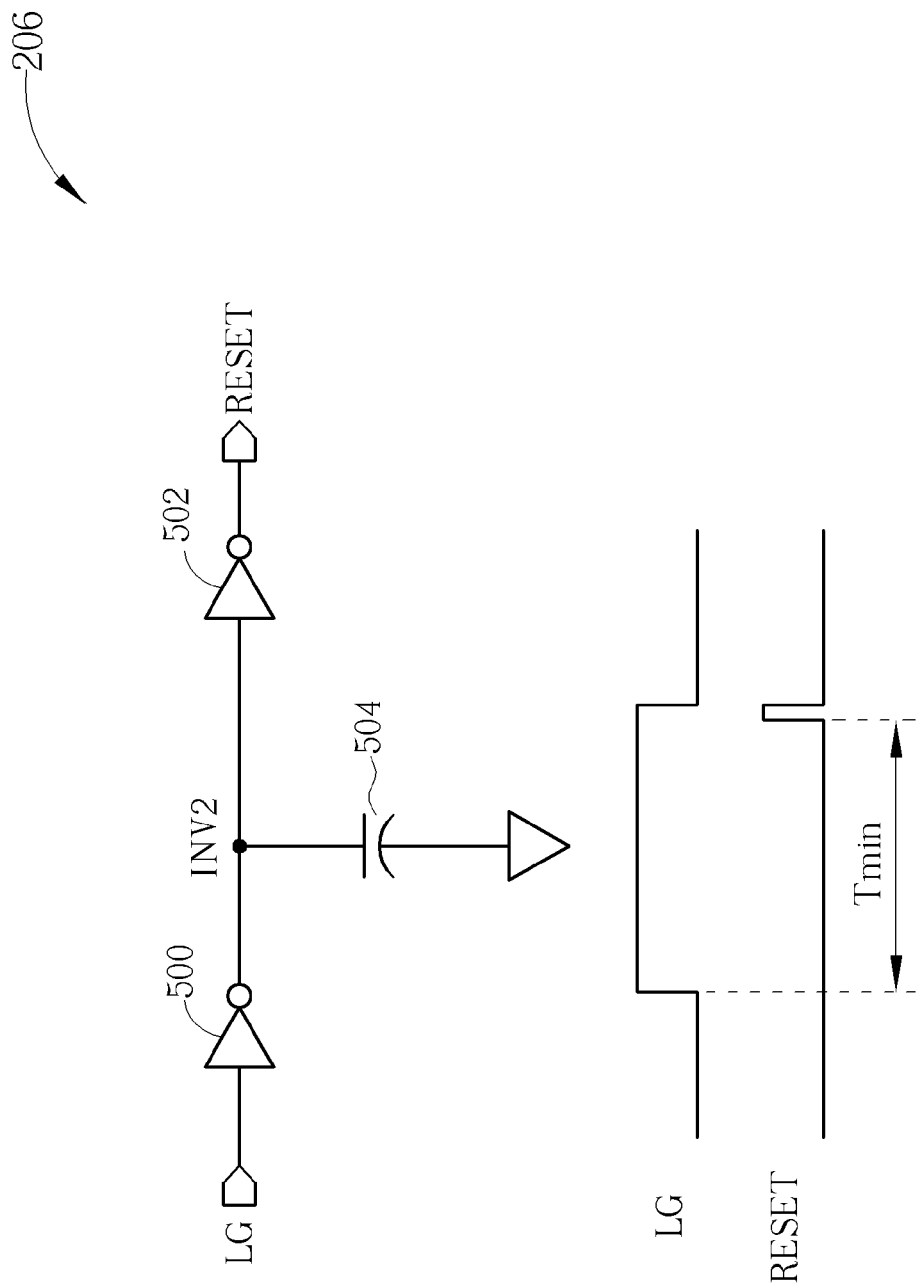

BOOTSTRAP DC-DC CONVERTER

BACKGROUND OF THE INVENTION

1. Field of the Invention

The present invention relates to a bootstrap DC-DC converter, and more particularly, to a bootstrap DC-DC converter capable of maintaining a bootstrap voltage such that an upper gate switch is turned on normally to prevent the bootstrap DC-DC converter from turning off at a high duty cycle due to under voltage protection (UVP).

2. Description of the Prior Art

Power supply devices play important roles in the modern information technology. Among all the power supply devices, DC-DC converters have been widely used, and are mainly utilized for providing a stable output voltage for electronic elements.

In short, please refer to FIG. 1, which is a schematic diagram of a conventional bootstrap DC-DC converter 10. As shown in FIG. 1, when a clock signal $V_{CLK}$ is with logic high to trigger a set terminal S of an SR flip-flop 100, the SR flip-flop 100 continues to output a control signal CON in logic high to a pre-driver 102. Therefore, the pre-driver 102 controls an upper gate driver 104 and a lower gate driver 106 to output an upper gate control signal UG and a lower gate control signal LG accordingly, such that the upper gate switch 108 is turned on and the lower gate switch 110 is turned off, to output an inductance current $I_L$ by an output inductor $L_O$ and then generate an output voltage $V_{OUT}$ for a load $R_{LOAD}$ by an output capacitor $C_O$ and an effective serial resistor RESR. Then, when a feedback voltage $V_F$ (a divided voltage generated from diving the output voltage $V_{OUT}$ by voltage dividing resistors R1 and R2) exceeds a reference voltage VREF, an error amplifier 112 outputs an error signal EAO (wherein a compensation network 118 performs compensation) to indicate a pulse width modulation (PWM) control loop 114 to reset a reset terminal R of the SR flip-flop 100, such that the SR flip-flog 100 outputs the control signal CON in logic low. Therefore, the pre-driver 102 turns off the upper gate switch 108 and turns on the lower gate switch 110 accordingly until the clock signal $V_{CLK}$ switches to another logic high to trigger the set terminal S of the SR flip-flop 100. Then, the above operations are repeated.

When the lower gate control signal LG is with logic high and thus the lower gate switch 110 is turned on, a switch 116 conducts connection between a system voltage PVCC and a bootstrap capacitor $C_{BOOT}$ to charge the bootstrap capacitor $C_{BOOT}$, where the voltage across the bootstrap capacitor is $V_{BOOT}$. Therefore, when the control signal CON is with logic high to turn on the upper gate switch 108, a driving voltage of the upper gate driver 104 is high enough to turn on the upper gate switch 108, wherein a voltage of a bootstrap voltage node BOOT is an input voltage $V_{IN}$ plus the bootstrap voltage $V_{BOOT}$ across the bootstrap capacitor $C_{BOOT}$, and the drain-source voltage of the upper gate switch 108 is the bootstrap voltage $V_{BOOT}$. The operation of the bootstrap DC-DC converter 10 is well-known for those skilled in the art, and hence the details are omitted herein.

For this structure, when the bootstrap DC-DC converter 10 is applied for converting a voltage in a high duty cycle (e.g. a difference between the input voltage $V_{IN}$ and the desired output voltage $V_{OUT}$ is smaller), the upper gate switch 108 is almost turned on all the time and the lower gate switch 110 is only occasionally turned on. Therefore, the bootstrap capacitor $C_{BOOT}$ is not charged enough, which causes the upper gate switch 108 unable to turn on and power of the input voltage $V_{IN}$ unable to deliver to the output voltage $V_{OUT}$. The bootstrap DC-DC converter 10 is therefore turned off due to under voltage protection.

For the above problem, a conventional improvement method is to add a charge pump such that a driving voltage of the upper gate driver 104 increases. However, the method consumes more layout area due to the charge pump. On the other hand, another conventional improvement method is to compare the bootstrap voltage $V_{BOOT}$ of the bootstrap capacitor $C_{BOOT}$ with a reference voltage by a comparator, and then force the lower gate switch 110 to turn on and charge the bootstrap capacitor $C_{BOOT}$ when the bootstrap voltage $V_{BOOT}$ is lower than the reference voltage. However, the method needs to implement the comparator with high voltage elements, and hence is with worse characteristics and also needs more layout area. Thus, there is a need for improvement of the prior art.

SUMMARY OF THE INVENTION

It is therefore an objective of the present invention to provide a bootstrap DC-DC converter capable of maintaining a bootstrap voltage such that an upper gate switch is turned on normally to prevent the bootstrap DC-DC converter from turning off at a high duty cycle due to under voltage protection (UVP).

The present invention discloses a bootstrap DC-DC converter. The bootstrap DC-DC converter comprises a lower gate driver, for generating a lower gate control signal according to a control signal; a lower gate switch, for turning on and off according to the lower gate control signal; and a bootstrap voltage maintaining circuit, for generating the control signal, such that the lower gate switch turns on at least a minimum off time each time.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5 is a schematic diagram of a minimum off control circuit shown in FIG. 2.

DETAILED DESCRIPTION

Figure 1:
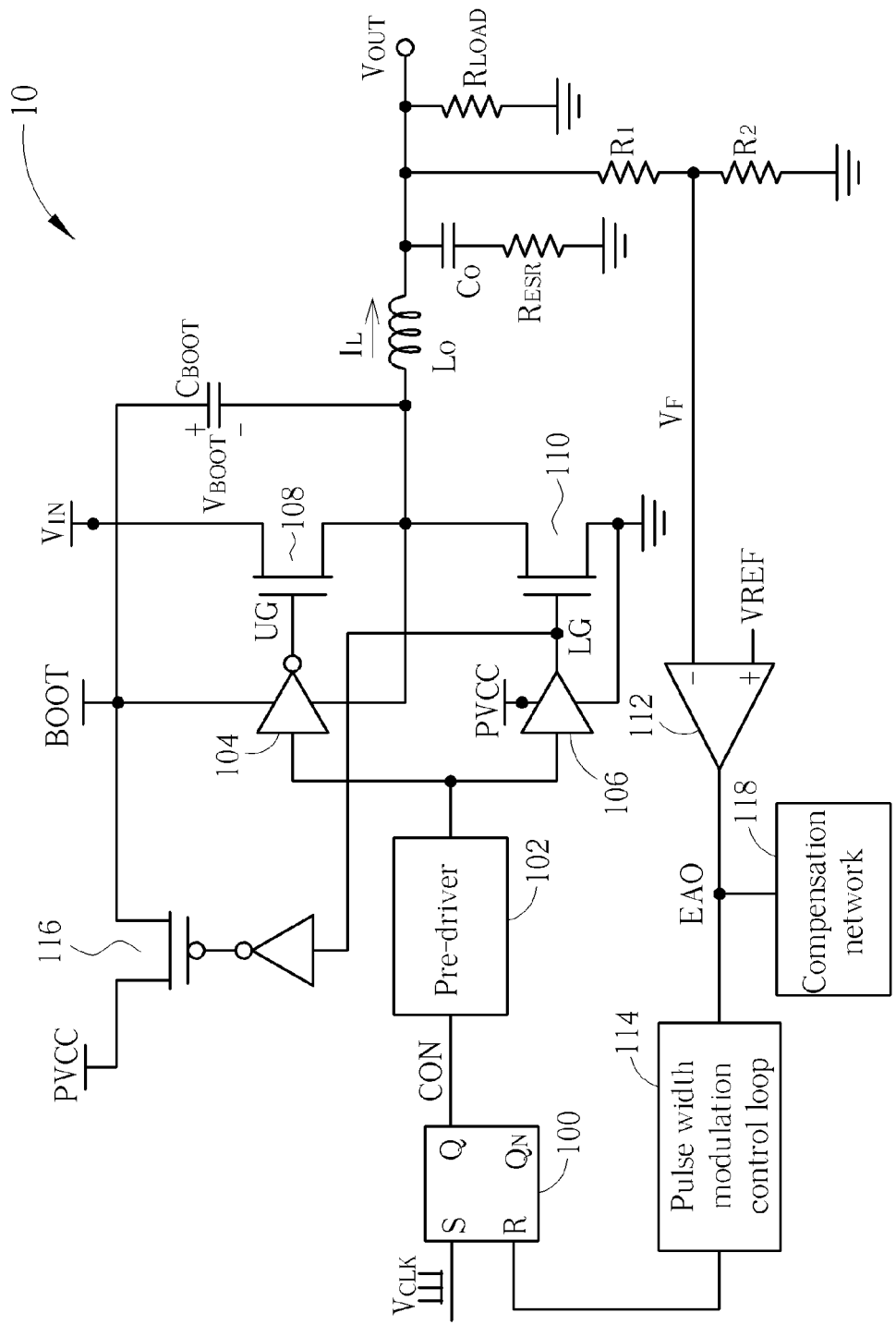
FIG. 1 is a schematic diagram of a conventional bootstrap DC-DC converter.
Figure 2:
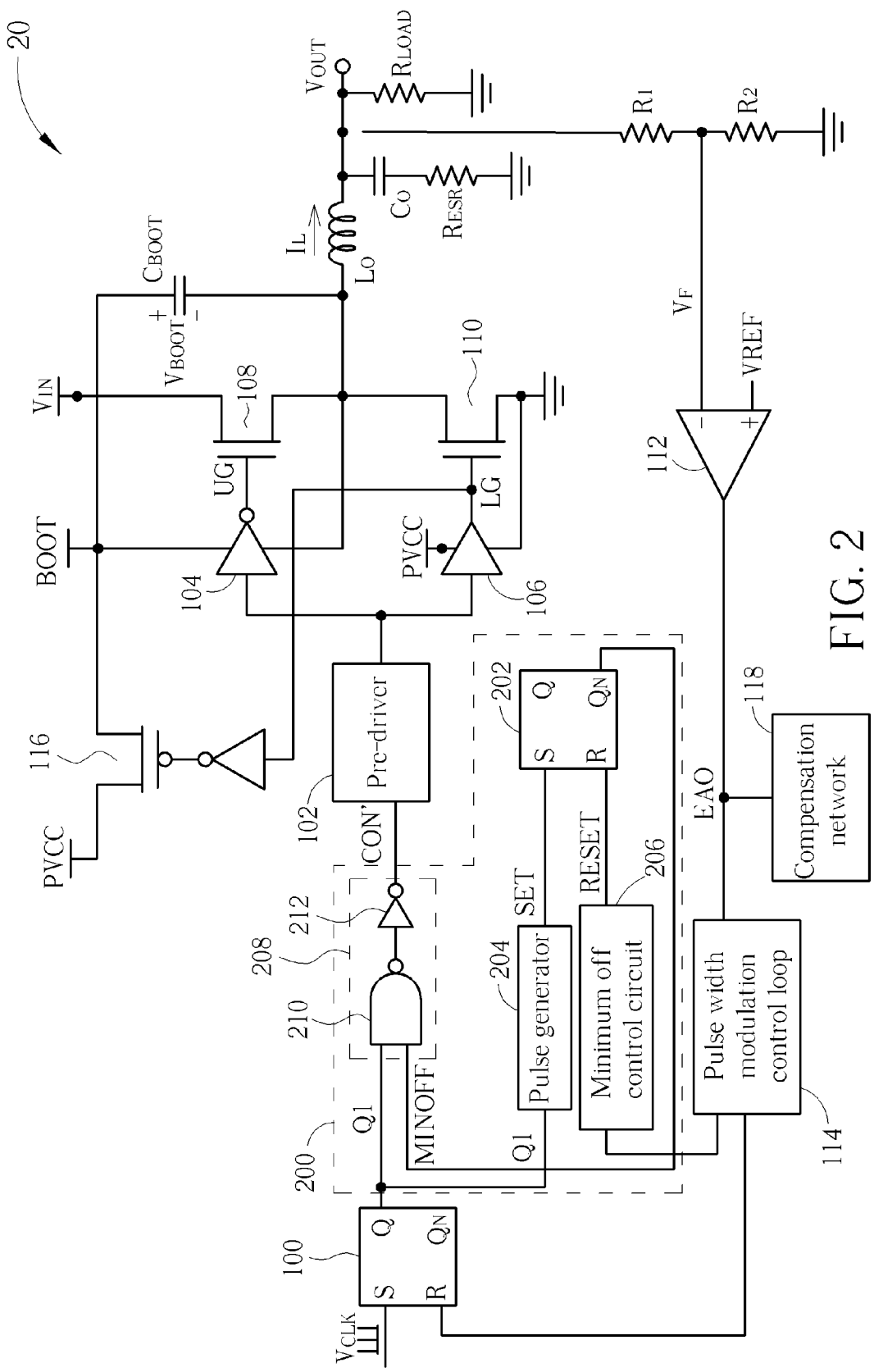
FIG. 2 is a schematic diagram of a bootstrap DC-DC converter according to an embodiment of the present invention.

Please refer to FIG. 2, which a schematic diagram of a bootstrap DC-DC converter 20 according to an embodiment of the present invention. The bootstrap DC-DC converter 20 and the bootstrap DC-DC converter 10 are similar in parts, so elements with the same function are denoted by the same symbol. Main differences between the bootstrap DC-DC converter 20 and the bootstrap DC-DC converter 10 are that an SR flip-flop 100 in the bootstrap DC-DC converter 20 outputs an activation signal Q1, and the bootstrap DC-DC converter 20 further includes a bootstrap voltage maintaining circuit 200 for generating a control signal CON', such that a lower gate switch 110 is turned on at least a minimum off time $T_{min}$ each time. In such a situation, since the lower gate switch 110 is turned on at least a minimum off time $T_{min}$ each time and the minimum off time $T_{min}$ can be properly designed as a time sufficient to charge the bootstrap capacitor $C_{BOOT}$ in order to normally turn on an upper gate switch 108. Therefore, even at a high duty cycle the bootstrap capacitor $C_{BOOT}$ can still be charged enough by the fixed minimum off time $T_{min}$ (i.e. there is an upper bound for a duty cycle). As a result, the present invention can maintain a bootstrap voltage $V_{BOOT}$ such that the upper gate switch 108 is turned on normally to prevent the bootstrap DC-DC converter from turning off at a high duty cycle due to under voltage protection.

In detail, the bootstrap voltage maintaining circuit 200 includes an SR flip-flop 202, a pulse generator 204, a minimum off control circuit 206 and a logic circuit 208. The pulse generator 204 generates a pulse setting signal SET to trigger a set terminal S of the SR flip-flop 202 at a falling edge of the activation signal Q1. The minimum off control circuit 206 generates a reset signal RESET to reset a reset terminal R of the SR flip-flop after the lower gate switch 110 turns on with the minimum off time $T_{min}$. The SR flip-flop 202 generates a minimum off signal MINOFF at a negative output terminal $Q_N$ according to the pulse setting signal SET and the reset signal RESET. The logic circuit 208 generates the control signal CON' according to the activation signal Q1 and the minimum off signal MINOFF. As a result, the bootstrap voltage maintaining circuit 200 can generate the control signal CON' to turn on the lower gate switch 110 at least a minimum off time $T_{min}$ each time.

Figure 3A:
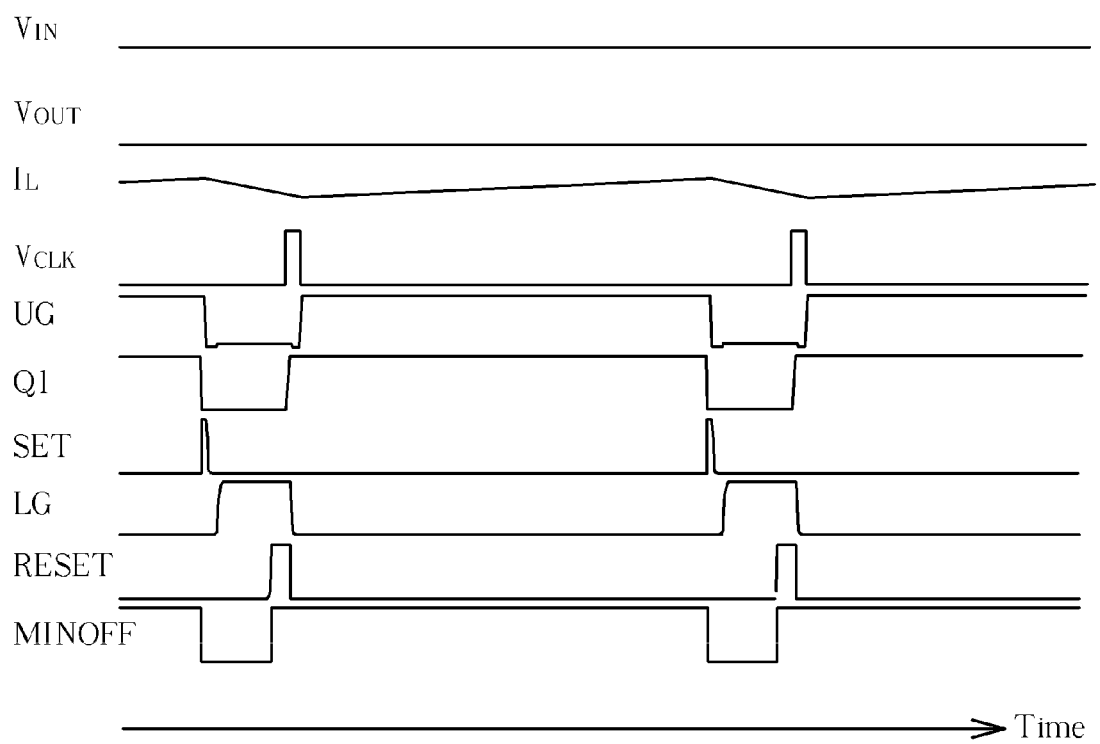
FIG. 3A is a signal diagram of the bootstrap DC-DC converter shown in FIG. 2 when a lower gate switch is not forced to turn on with a minimum off time.
Figure 3B:
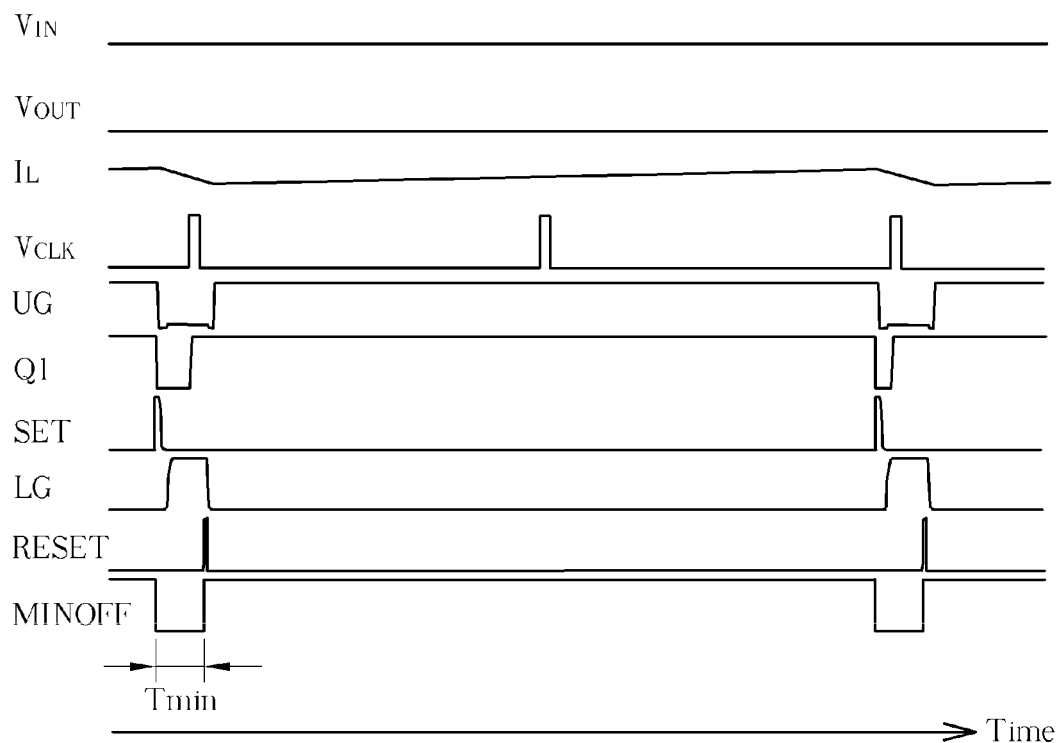
FIG. 3B is a signal diagram of the bootstrap DC-DC converter shown in FIG. 2 when the lower gate switch is forced to turn on with a minimum off time.

Specifically, please refer to FIG. 3A and 3B, wherein FIG. 3A is a signal diagram of the bootstrap DC-DC converter shown in FIG. 2 when a lower gate switch 110 is not forced to turn on with a minimum off time $T_{min}$, and FIG. 3B is a signal diagram of the bootstrap DC-DC converter shown in FIG. 2 when the lower gate switch 110 is forced to turn on with a minimum off time $T_{min}$. As shown in FIGS. 2 and 3A, when a feedback voltage $V_F$ is greater than a reference voltage VREF (i.e. an output voltage $V_{OUT}$ reaches to a desired voltage), a pulse width modulation (PWM) control loop 114 resets the reset terminal of the SR flip-flop 100, such that the activation signal Q1 switches to logic low. At this moment, a NAND gate 210 in the logic circuit 208 determines the activation signal Q1 as logic low and thus outputs a signal with logic high (the NAND gate 210 outputs a signal with logic high if either the activation signal Q1 or the minimum off signal MINOFF is with logic low). Then the control signal CON' with logic low is outputted by an inverter 212 in the logic circuit 208. Therefore, the upper gate control signal UG is switched to logic low to turn off the upper gate switch 108 and the lower gate control signal LG is switched to logic high to turn on the lower gate switch 110. In the meantime, the pulse generator 204 generates the pulse setting signal SET to trigger a set terminal S of the SR flip-flop at a falling edge of the activation signal Q1, such that the SR flip-flop 202 switches the minimum off signal MINOFF generated at the negative output terminal $Q_N$ to logic low, and the minimum off control circuit 206 counts the turn-on time of the lower gate switch 110 according to an output of the pulse width modulation control loop 114.

Then, when the counting result of the minimum off control circuit 206 shows that the lower gate switch 110 turns on with the minimum off time $T_{min}$, the minimum off control circuit 206 generates the reset signal RESET with logic high to reset the reset terminal R of the SR flip-flop 202. Therefore, the SR flip-flop 202 switches the minimum off signal MINOFF generated at the negative output terminal $Q_N$ to logic high. After that, the clock signal $V_{CLK}$ is with logic high to trigger the set terminal S of the SR flip-flop 100, and the SR flip-flop 100 continues to output the activation signal Q1 with logic high. Since both the activation signal Q1 and the minimum off signal MINOFF are with logic high, the NAND 210 outputs a signal with logic low. Then the control signal CON' with logic high is outputted by an inverter 212, such that the upper gate control signal UG is switched to logic high to turn on the upper gate switch 108 and the lower gate control signal LG is switched to logic low to turn off the lower gate switch 110. Afterward the above operation is repeated. In such a situation, since the clock signal $V_{CLK}$ is with logic high only after the lower gate switch 110 is turned on with the minimum off time $T_{min}$, the lower gate switch 110 is not forced to turn on with the minimum off time $T_{min}$ (the turn-on time of the lower gate switch 110 is longer than the minimum off time $T_{min}$ under the operation of the clock signal $V_{CLK}$), and a switching frequency of the bootstrap DC-DC converter 20 is equal to the frequency of the clock signal $V_{CLK}$.

On the other hand, as shown in FIGS. 2 and 3B, when a feedback voltage $V_F$ is greater than a reference voltage VREF (i.e. an output voltage $V_{OUT}$ reaches to a desired voltage), the pulse width modulation (PWM) control loop 114 resets the reset terminal of the SR flip-flop 100, such that the activation signal Q1 switches to logic low. At this moment, the NAND gate 210 in the logic circuit 208 determines the activation signal Q1 as logic low and thus outputs a signal with logic high (the NAND gate 210 outputs a signal with logic high if either the activation signal Q1 or the minimum off signal MINOFF is with logic low). Then the control signal CON' with logic low is outputted by the inverter 212 in the logic circuit 208. Therefore, the upper gate control signal UG is switched to logic low to turn off the upper gate switch 108 and the lower gate control signal LG is switched to logic high to turn on the lower gate switch 110. In the meantime, the pulse generator 204 generates the pulse setting signal SET to trigger the set terminal S of the SR flip-flop at a falling edge of the activation signal Q1, such that the SR flip-flop 202 switches the minimum off signal MINOFF generated at the negative output terminal $Q_N$ to logic low, and the minimum off control circuit 206 counts the turn-on time of the lower gate switch 110 according to an output of the pulse width modulation control loop 114. This part of operation is similar to the one shown in FIG. 3A.

Then, when the counting result of the minimum off control circuit 206 shows that the lower gate switch 110 is not turned on with the minimum off time $T_{min}$, the clock signal $V_{CLK}$ is with logic high to trigger the set terminal S of the SR flip-flop 100, and the SR flip-flop 100 continues to output the activation signal Q1 with logic high. At this moment, since the minimum off signal MINOFF is still with logic low, the control signal CON' is also with logic low.

Thus, the upper gate control signal UG maintains in logic low to turn off the upper gate switch 108 and the lower gate control signal LG maintains in logic high to turn on the lower gate switch 110. After that, when the counting result shows that the lower gate switch 110 is turned on with the minimum off time $T_{min}$, the minimum off control circuit 206 generates the reset signal RESET with logic high to reset the reset terminal R of the flip-flop 202. Therefore, the SR flip-flop 202 switches the minimum off signal MINOFF generated at the negative output terminal $Q_N$ to logic high. At this moment, since both the activation signal Q1 and the minimum off signal MINOFF are with logic high, the NAND 210 outputs a signal with logic low. Then the control signal CON' with logic high is outputted by an inverter 212, such that the upper gate control signal UG is switched to logic high to turn on the upper gate switch 108 and the lower gate control signal LG is switched to logic low to turn off the lower gate switch 110. Afterward the above operation is repeated.

In such a situation, since the clock signal $V_{CLK}$ is with logic high before the lower gate switch 110 is turned on with the minimum off time $T_{min}$ the lower gate switch 110 still needs to be forced to turn on with the minimum off time $T_{min}$ before turning off (the turn-on time of the lower gate switch 110 is shorter than the minimum off time $T_{min}$ under the operation of the clock signal $V_{CLK}$ in FIG. 3B). Since the turn-on time of the lower gate switch 110 becomes longer and the upper gate switch 108 needs to be turned on with longer time so as to raise the output voltage $V_{OUT}$ to the desired level, a switching frequency of the bootstrap DC-DC converter 20 decreases and is lower than the frequency of the clock signal $V_{CLK}$ at a high duty cycle.

Figure 3C:
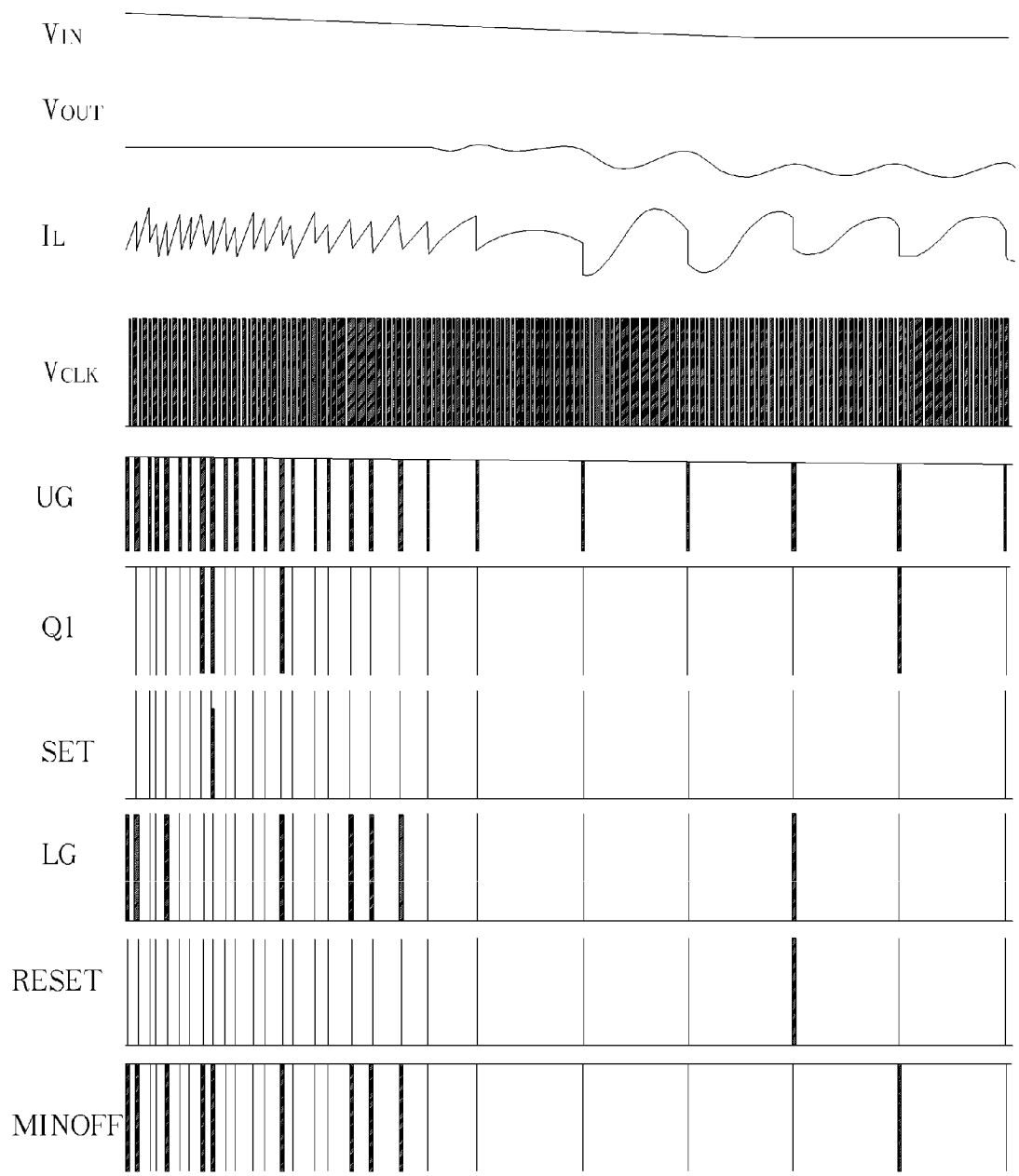
FIG. 3C is a signal diagram of the bootstrap DC-DC converter shown in FIG. 2 when the lower gate switch is forced to turn on with the minimum off time and an input voltage decreases gradually.

Please refer to FIG. 3C, which is a signal diagram of the bootstrap DC-DC converter 20 shown in FIG. 2 when the lower gate switch is forced to turn on with the minimum off time and the input voltage $V_{IN}$ decreases gradually. As shown in FIG. 3C, when the input voltage $V_{IN}$ decreases gradually to approach the desired voltage $V_{OUT}$ the duty cycle is getting higher, such that the upper gate control signal UG and the lower gate control signal LG reduce the on-off switching frequency of the upper gate switch 108 and the lower gate switch 110 (i.e. lengthening the on-off switching period).

Noticeably, the spirit of the present invention is to turn on the lower gate switch 110 with a minimum off time $T_{min}$ each time, so as to charge the bootstrap capacitor $C_{BOOT}$ with a duration that is enough to normally turn on the upper gate switch 108. The bootstrap voltage $V_{BOOT}$ can therefore be maintained to normally turn on the upper gate switch 108, preventing the DC-DC converter from turning off at a high duty cycle due to under voltage protection. Those skilled in the art can make modifications or alterations accordingly. For example, in the above embodiment the minimum off control circuit 206 counts the turn-on time of the lower gate switch 110 according to an output of the pulse width modulation control loop 114. However, in other embodiments, the minimum off control circuit 206 can also count the turn-on time of the lower gate switch 110 according to the lower gate control signal LG.

Figure 4:
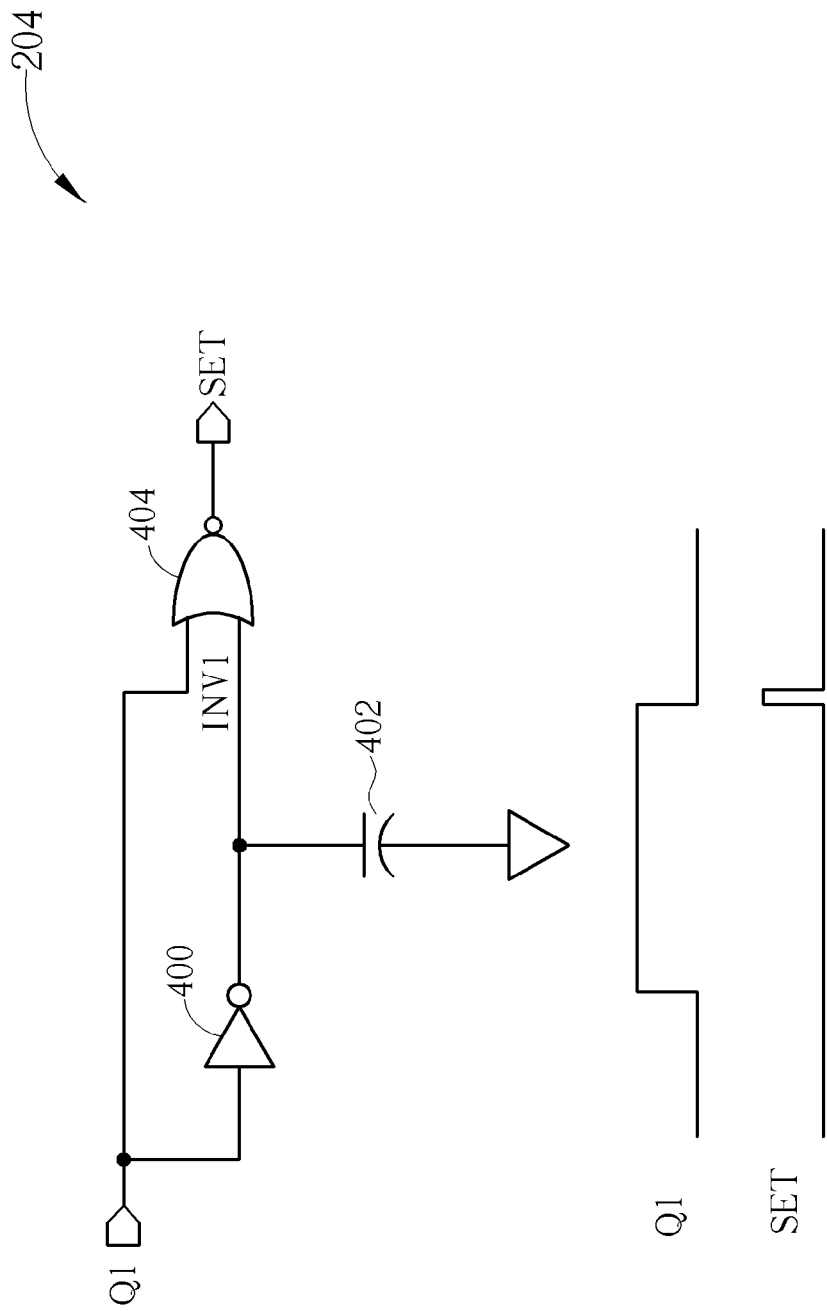
FIG. 4 is a schematic diagram of a pulse generator shown in FIG. 2.

Besides, please refer to FIG. 4, which is a schematic diagram of a pulse generator 204 shown in FIG. 2. As shown in FIG. 4, the pulse generator 204 includes an inverter 400, a capacitor 402 and a NOR gate 404. The inverter 400 receives the activation signal Q1 to generate an inverting signal INV1. The capacitor 402 is coupled between the inverter 400 and a ground terminal. The NOR gate 404 generates the pulse setting signal SET according to the activation signal Q1 and the inverting signal INV1. For this structure, since the capacitor 402 is charged by a weak pull high of a P-type transistor of the inverter 400 when the activation signal Q1 is with logic low, the inverter 400 can not immediately switch the inverting signal INV1 to logic high when a falling edge of the activation signal Q1 is switched to logic low. Thus the NOR gate 404 can generate an output in logic high.

Moreover, please refer to FIG. 5, which is a schematic diagram of a minimum off control circuit 206 shown in FIG. 2. As shown in FIG. 5, the minimum off control circuit 206 includes inverters 500, 502 and a capacitor 504. The inverter 500 receives a signal related to the lower gate control signal LG (e.g. receiving an output of the pulse width modulation control loop 114 as shown in FIG. 2, or the lower gate control signal LG as shown in FIG. 5) to generate an inverting signal INV2. The capacitor 504 is coupled between the inverter 500 and a ground terminal. The inverter 502 generates the reset signal SET according to the inverting signal INV2. For this structure, when the signal related to the lower gate control signal LG is with logic high, the capacitor 504 is discharged by a weak pull low of a N-type transistor of the inverter 500. Therefore, the inverter 500 can not immediately switch the inverting signal INV2 to logic high when a falling edge of a signal related to the lower gate control signal LG is switched to logic low. Thus the inverter 502 can generate the reset signal SET in logic high owing to a delay, which is the minimum off time $T_{min}$.

In the prior art, the improvement method which increases a driving voltage of the upper gate driver 104 by adding a charge pump consumes more layout area due to the charge pump. Another improvement method, which compares the bootstrap voltage $V_{BOOT}$ of the bootstrap capacitor $C_{BOOT}$ with a reference voltage by a comparator and then forces the lower gate switch 110 to turn on and charges the bootstrap capacitor $C_{BOOT}$ when the bootstrap voltage $V_{BOOT}$ is lower than the reference voltage, needs the comparator to be realized by high voltage elements, and hence is with worse characteristics and also needs more layout area. In comparison, the present invention turns on the lower gate switch 110 with at least a minimum off time $T_{min}$ each time so as to charge the bootstrap capacitor $C_{BOOT}$ with a time sufficient to normally turn on the upper gate switch 108. Therefore, the bootstrap voltage $V_{BOOT}$ can be maintained such that the upper gate switch 108 is turned on normally, to prevent the bootstrap DC-DC converter from turning off at a high duty cycle due to under voltage protection.

Those skilled in the art will readily observe that numerous modifications and alterations of the device and method may be made while retaining the teachings of the invention. Accordingly, the above disclosure should be construed as limited only by the metes and bounds of the appended claims.

The invention claimed is:
1. A bootstrap DC-DC converter, comprising:
  a lower gate driver, for generating a lower gate control signal according to a control signal;
  a lower gate switch, for turning on and off according to the lower gate control signal;
  a bootstrap voltage maintaining circuit, for generating the control signal, such that the lower gate switch turns on for at least a minimum off time in each duty cycle of the lower gate control signal;
  an upper gate driver, driven by a bootstrap voltage, for generating an upper gate control signal according to the control signal;
  an upper gate switch, coupled to the lower gate switch, for turning on and off according to the upper gate control signal;
  a bootstrap capacitor, comprising a terminal coupled between the upper gate switch and the lower gate switch, and generating the bootstrap voltage; and
  a switch, for conducting and cutting off connection between a system voltage and another terminal of the bootstrap capacitor according to the lower gate control signal;
  wherein the switch conducts the connection between the system voltage and the another terminal of the bootstrap capacitor to charge the bootstrap capacitor when the lower gate switch is turned on for at least a minimum off time in each duty cycle of the lower gate control signal, such that an input voltage coupled to the upper gate switch is converted to an output voltage and a switching frequency of the bootstrap DC-DC converter is reduced at a high duty cycle;

wherein the bootstrap voltage maintain circuit further comprises:
- a first SR flip-flop, for generating a minimum off signal at a negative output terminal;
- a pulse generator, for generating a pulse setting signal to trigger a set terminal of the first SR flip-flop at a falling edge of a activation signal;
- a minimum off control circuit, for generating a reset signal to reset a reset terminal of the first SR flip-flop when the lower gate switch turns on with the minimum off time; and
- a logic circuit, for generating the control signal according to the activation signal and the minimum off signal;

wherein the pulse generator further comprises:
- a first inverter, for receiving the activation signal to generate a first inverting signal;
- a first capacitor, coupled between the first inverter and a ground terminal; and
- a NOR gate, directly connected to the first inverter and the first capacitor, for generating the pulse setting signal according to the activation signal and the first inverting signal.

2. The bootstrap DC-DC converter of claim 1 further comprises a second SR flip-flop, comprising a set terminal for receiving a clock signal and a positive output terminal for outputting the activation signal.

3. The bootstrap DC-DC converter of claim 1, wherein the minimum off control circuit comprises:
- a second inverter, for receiving a signal related to the lower gate control signal to generate a second inverting signal;
- a capacitor, coupled between the second inverter and a ground terminal; and
- a third inverter, for generating the reset signal according to the second inverting signal.

* * * * *